United States Patent
Park et al.

(10) Patent No.: US 12,552,962 B2
(45) Date of Patent: *Feb. 17, 2026

(54) CMP SLURRY COMPOSITION FOR POLISHING TUNGSTEN PATTERN WAFER AND METHOD OF POLISHING TUNGSTEN PATTERN WAFER USING THE SAME

(71) Applicant: SAMSUNG SDI CO., LTD., Yongin-si (KR)

(72) Inventors: Tae Won Park, Suwon-si (KR); Jin Gyo Kim, Suwon-si (KR); Ji Ho Lee, Suwon-si (KR); Eui Rang Lee, Suwon-si (KR); Dong Hyeon Lee, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 351 days.

This patent is subject to a terminal disclaimer.

(21) Appl. No.: 17/981,795

(22) Filed: Nov. 7, 2022

(65) Prior Publication Data

US 2023/0220241 A1    Jul. 13, 2023

(30) Foreign Application Priority Data

Jan. 7, 2022  (KR) .................. 10-2022-0002682

(51) Int. Cl.
| | |
|---|---|
| *C09G 1/02* | (2006.01) |
| *H01L 21/306* | (2006.01) |
| *B24B 37/04* | (2012.01) |
| *C23F 1/26* | (2006.01) |
| *H01L 21/321* | (2006.01) |

(52) U.S. Cl.
CPC .......... *C09G 1/02* (2013.01); *H01L 21/30625* (2013.01); *B24B 37/044* (2013.01); *C23F 1/26* (2013.01); *H01L 21/3212* (2013.01)

(58) Field of Classification Search
CPC . C09G 1/02; H01L 21/30625; H01L 21/3212; H01L 21/3213; B24B 37/044; C23F 1/26; C09K 3/14; C09K 3/1436; C09K 3/1454; C09K 3/1463

USPC ................................................ 252/79.1–79.5
See application file for complete search history.

(56) References Cited

U.S. PATENT DOCUMENTS

| | | | |
|---|---|---|---|
| 6,579,668 B1 * | 6/2003 | Baik ....................... G03F 7/425 510/176 |
| 9,567,491 B2 * | 2/2017 | Fu ..................... H01L 21/31053 |
| 2003/0173329 A1 * | 9/2003 | Matsui ................ H01L 21/3212 216/2 |
| 2005/0176243 A1 * | 8/2005 | Han ................... H01L 21/31111 257/E21.255 |
| 2018/0257194 A1 * | 9/2018 | Yoshizaki ......... H01L 21/30625 |
| 2021/0230451 A1 | 7/2021 | Kim et al. |
| 2022/0298381 A1 * | 9/2022 | Sim ......................... C08L 79/02 |
| 2022/0325139 A1 | 10/2022 | Hong et al. |
| 2022/0348790 A1 * | 11/2022 | Chi .......................... C09G 1/02 |
| 2024/0030041 A1 * | 1/2024 | Park ...................... C09K 3/1463 |

FOREIGN PATENT DOCUMENTS

| | | | | |
|---|---|---|---|---|
| CN | 113150694 A | 7/2021 | | |
| CN | 115197645 A | 10/2022 | | |
| JP | H 10-284596 A | 10/1998 | | |
| JP | 2000-160142 A | 6/2000 | | |
| JP | 2002-158194 A | 5/2002 | | |
| JP | 2007-273641 A | 10/2007 | | |
| JP | 2021-118362 A | 8/2021 | | |
| KR | 10-2006-0017140 A | 2/2006 | | |
| KR | 10-2021-0085574 A | 7/2021 | | |
| KR | 20210143543 A | * 11/2021 | ........... C09K 3/1409 |

OTHER PUBLICATIONS

KR-20210143543 A (Year: 2021)—english machine translation.*
Chinese Office action dated Oct. 19, 2024.
Japanese Office Action issued on Dec. 25, 2023, in the corresponding Japanese Patent Application No. 2022-178909.
Korean Office action dated Jan. 6, 2025.

* cited by examiner

*Primary Examiner* — Anita K Alanko
(74) *Attorney, Agent, or Firm* — Lee IP Law, P.C.

(57) ABSTRACT

A CMP slurry composition for polishing a tungsten pattern wafer and a method of polishing a tungsten pattern wafer, the CMP slurry composition includes a solvent; an abrasive agent containing silica modified with a silane compound having at least one nitrogen atom; and an alkylene oxide group-containing fluorine surfactant.

8 Claims, No Drawings

CMP SLURRY COMPOSITION FOR POLISHING TUNGSTEN PATTERN WAFER AND METHOD OF POLISHING TUNGSTEN PATTERN WAFER USING THE SAME

CROSS-REFERENCE TO RELATED APPLICATION

This application claims the benefit of Korean Patent Application No. 10-2022-0002682, filed on Jan. 7, 2022, in the Korean Intellectual Property Office, the entire disclosure of which is incorporated herein by reference.

BACKGROUND

1. Field

Embodiments relate to a CMP slurry composition for polishing a tungsten pattern wafer and a method of polishing a tungsten pattern wafer using the same.

2. Description of the Related Art

A chemical mechanical polishing (CMP) composition and a method of polishing (or flattening) a substrate surface may be used. A polishing composition for polishing a metal layer (e.g., a tungsten layer) on a semiconductor substrate may include abrasive particles suspended in an aqueous solution and chemical accelerators, e.g., an oxidizing agent, a catalyst, or the like.

A process of polishing a metal layer using the CMP slurry composition may include polishing only the metal layer, polishing the metal layer and a barrier layer, and polishing the metal layer, the barrier layer, and an oxide layer. Among these steps, in the step of polishing the metal layer, the barrier layer, and the oxide layer, a composition for polishing a tungsten pattern wafer may be used, and good polishing flatness can be achieved under conditions that the metal layer and the oxide layer are polished at a suitable polishing rate.

SUMMARY

The embodiments may be realized by providing a CMP slurry composition for polishing a tungsten pattern wafer, the CMP slurry composition including a solvent; an abrasive agent containing silica modified with a silane compound having at least one nitrogen atom; and an alkylene oxide group-containing fluorine surfactant.

The alkylene oxide group-containing fluorine surfactant may be a non-ionic surfactant.

The alkylene oxide group of the alkylene oxide group-containing fluorine surfactant may include an ethylene oxide group.

The alkylene oxide group of the alkylene oxide group-containing fluorine surfactant may further include a propylene oxide group.

The surfactant may contain the alkylene oxide group in an amount of greater than 0 moles and less than or equal to 10 moles.

The surfactant may include a linear or branched fluorinated $C_1$ to $C_{12}$ alkyl group or a linear or branched fluorinated $C_1$ to $C_{12}$ alkoxy group.

The surfactant may be a per-fluorinated surfactant.

The silica may have a positive charge on a surface thereof.

The silane compound may be an amino silane containing 1 to 5 nitrogen atoms.

The CMP slurry composition may include 0.001 wt % to 20 wt % of the abrasive agent, 0.001 ppm to 200 ppm of the surfactant, 0.1 ppm to 1,000 ppm of an organic acid, 1 ppm to 1,000 ppm of a catalyst, and 0.001 wt % to 10 wt % of an amino acid.

The composition may have a pH of 3 to 7.

The embodiments may be realized by providing a method of polishing a tungsten pattern wafer, the method including polishing a tungsten pattern wafer using the CMP slurry composition according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. As used herein, the term "or" is not an exclusive term, e.g., "A or B" would include A, B, or A and B.

As used herein, the term "substituted" in the term "substituted or unsubstituted" means that at least one hydrogen atom in a corresponding functional group is substituted with one selected from the group of a hydroxyl group, a $C_1$ to $C_{20}$ alkyl or halo-alkyl group, a $C_2$ to $C_{20}$ alkenyl or halo-alkenyl group, a $C_2$ to $C_{20}$ alkynyl or halo-alkynyl group, a $C_3$ to $C_{20}$ cycloalkyl group, a $C_3$ to $C_{20}$ cycloalkenyl group, a $C_6$ to $C_{20}$ aryl group, a $C_7$ to $C_{20}$ arylalkyl group, a $C_1$ to $C_{20}$ alkoxy group, a $C_6$ to $C_{20}$ aryloxy group, an amino group, a halo group, a cyano group, and a thiol group.

Herein, "monovalent aliphatic hydrocarbon group" may be a substituted or unsubstituted $C_1$ to $C_{20}$ linear or branched alkyl group, preferably a $C_1$ to $C_{10}$ alkyl group, more preferably a $C_1$ to $C_5$ alkyl group.

Herein, "monovalent alicyclic hydrocarbon group" may be a substituted or unsubstituted $C_3$ to $C_{20}$ cycloalkyl group, preferably a $C_3$ to $C_{10}$ cycloalkyl group, more preferably a $C_3$ to $C_5$ cycloalkyl group.

Herein, "monovalent aromatic hydrocarbon group" may be a substituted or unsubstituted $C_6$ to $C_{20}$ aryl group or a substituted or unsubstituted $C_7$ to $C_{20}$ arylalkyl group, preferably a $C_6$ to $C_{10}$ aryl group or a $C_7$ to $C_{10}$ arylalkyl group.

Herein, "bivalent aliphatic hydrocarbon group", "bivalent alicyclic hydrocarbon group" or "bivalent aromatic hydrocarbon group" means a modified bivalent group of the "monovalent aliphatic hydrocarbon group", the "monovalent alicyclic hydrocarbon group", or the "monovalent aromatic hydrocarbon group".

For example, the "bivalent aliphatic hydrocarbon group" may be a substituted or unsubstituted $C_1$ to $C_{20}$ linear or branched alkylene group, preferably a $C_1$ to $C_{10}$ alkylene group, more preferably a $C_1$ to $C_5$ alkylene group; the "bivalent alicyclic hydrocarbon group" may be a substituted or unsubstituted $C_3$ to $C_{20}$ cycloalkylene group, preferably a $C_3$ to $C_{10}$ cycloalkylene group, more preferably a $C_3$ to $C_5$ cycloalkylene group; and the "bivalent aromatic hydrocarbon group" may be a substituted or unsubstituted $C_6$ to $C_{30}$ arylene group or a substituted or unsubstituted $C_7$ to $C_{20}$ arylalkylene group, preferably a $C_6$ to $C_{10}$ arylene group, or a $C_7$ to $C_{10}$ arylalkylene group.

As used herein to represent a specific numerical range, "X to Y" means "greater than or equal to X and less than or equal to Y".

The embodiments relate to a CMP slurry composition for polishing a tungsten pattern wafer. The composition may include, e.g., silica modified with a silane compound having at least one nitrogen atom as an abrasive agent to help increase the polishing rate of the tungsten pattern wafer. A CMP slurry composition including silica modified with a silane compound having at least one nitrogen atom as an abrasive agent can adsorb the by-products produced during polishing or the abrasive agent to a polishing pad or a brush, upon polishing the tungsten pattern wafer therewith. Adsorption of the by-products produced during polishing or the abrasive agent to the polishing pad could cause a reduction in lifespan of the polishing pad and the by-products produced during polishing or the abrasive agent accumulated on the brush could provide a defect to a polishing target, thereby causing deterioration in flatness of the polishing target. Addition of certain additives to the CMP slurry composition to help suppress adsorption of the by-products produced during polishing or the abrasive agent could cause reduction in polishing rate of the oxide layer. When a certain surfactant is added to the abrasive agent containing silica modified with a silane compound having at least one nitrogen atom, it is possible to help suppress the adsorption of the by-products produced during polishing or the abrasive agent, while maintaining a high polishing rate of the oxide layer.

In an implementation, a CMP slurry composition for polishing a tungsten pattern wafer (hereinafter referred to as "CMP slurry composition") may include, e.g., a solvent (e.g., a polar solvent or a non-polar solvent); an abrasive agent containing silica modified with a silane compound having at least one nitrogen atom; and an alkylene oxide group-containing fluorine surfactant.

Hereinafter, components of the CMP slurry composition according to the embodiments will be described in detail.

Solvent

A polar solvent or a non-polar solvent may help reduce friction upon polishing a tungsten pattern wafer with an abrasive agent. The solvent may include, e.g., water (e.g., ultrapure water or deionized water), an organic amine, an organic alcohol, an organic alcohol amine, an organic ether, an organic ketone, or the like. In an implementation, the solvent may include, e.g., ultrapure water or deionized water. In an implementation, the solvent may be included in a balance amount, e.g., in an amount of 30 wt % to 99 wt %, in the CMP slurry composition (e.g., based on a total weight of the CMP slurry composition).

Abrasive Agent

The abrasive agent may help polish an insulating layer (e.g., a silicon oxide layer) and a tungsten pattern wafer at a high polishing rate.

The abrasive agent may include silica modified with a silane compound containing at least one nitrogen atom. The modified silica may help increase the polishing rate of the insulating layer while suppressing generation of scratches, as compared with non-modified silica. In an implementation, the modified silica may help secure a high polishing rate of the tungsten pattern wafer even in a pH range of a weak acid higher than a strong acid pH range of other CMP slurry compositions.

In an implementation, the silica may be modified only with the silane compound having at least one nitrogen atom, and the silica may have a positive charge on the surface thereof. The silica may have a surface zeta potential of, e.g., +10 mV to +100 mV, +10 mV, +15 mV, +20 mV, +25 mV, +30 mV, +35 mV, +40 mV, +45 mV, +50 mV, +55 mV, +60 mV, +65 mV, +70 mV, +75 mV, +80 mV, +85 mV, +90 mV, +95 mV, +100 mV, or +20 mV to +60 mV. Within these ranges, the silica may assist in improvement in polishing rate of the insulating layer.

The modified silica may include spherical or non-spherical particles, in which primary particles have an average particle diameter (D50) of, e.g., 10 nm to 200 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, 200 nm, 20 nm to 180 nm, or 30 nm to 150 nm. Within these ranges, the CMP slurry composition may help secure a sufficient polishing rate with respect to the insulating layer and the tungsten pattern wafer, which are polishing targets. The "average particle diameter (D50)" means the diameter of particles corresponding to 50 vol % in a volume distribution of the abrasive agent.

The silica modified with the silane compound containing at least one nitrogen atom may be prepared by adding the silane compound containing at least one nitrogen atom to non-modified silica, followed by reaction for a predetermined period of time. The non-modified silica may have a negative charge on the surface thereof and may include, e.g., colloidal silica or fumed silica.

In an implementation, the modified silica may be prepared by adding an amino silane containing at least one nitrogen atom to the non-modified silica in a mole ratio of 0.02 to 1 under acidic conditions, followed by stirring at 50° C. to 80° C. for 10 hours to 30 hours. The acidic conditions may be obtained by adding an acid, e.g., hydrochloric acid, hydrofluoric acid, acetic acid, nitric acid, sulfuric acid, or the like. In an implementation, the non-modified silica may be, e.g., PL series 2 to 20 (FUSO Co., Ltd.).

In an implementation, the silica may be modified with an amino silane containing at least one nitrogen atom, e.g., from 1 to 5 nitrogen atoms. In an implementation, the silica may be modified with an amino silane containing two nitrogen atoms or an amino silane containing three nitrogen atoms, both of which may help further increase the polishing rate, as compared with an amino silane containing one nitrogen atom.

Silane compound containing two nitrogen atoms

A silane containing two nitrogen atoms may include, e.g., a compound of Formula 1, a cation derived from the compound of Formula 1, or a salt of the compound of Formula 1.

[Formula 1]

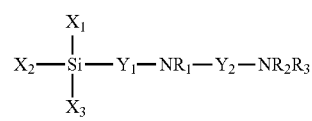

In Formula 1, $X_1$, $X_2$ and $X_3$ may each independently be or include, e.g., a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group.

In an implementation, at least one of $X_1$, $X_2$ and $X_3$ may be, e.g., a hydroxyl group, a substituted or unsubstituted $C_1$ to $C_{20}$ alkoxy group, or a substituted or unsubstituted $C_6$ to $C_{20}$ aryloxy group.

$Y_1$ and $Y_2$ may each independently be or include, e.g., a single bond, a bivalent aliphatic hydrocarbon group, a bivalent alicyclic hydrocarbon group, or a bivalent aromatic hydrocarbon group.

$R_1$, $R_2$ and $R_3$ may each independently be or include, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

In an implementation, the abrasive agent may include silica modified with the compound of Formula 1.

In an implementation, in Formula 1, $X_1$, $X_2$ and $X_3$ may each independently be, e.g., a hydroxyl group, a substituted or unsubstituted $C_1$ to $C_{20}$ alkyl group, or a substituted or unsubstituted $C_1$ to $C_{20}$ alkoxy group, in which at least one of $X_1$, $X_2$ and $X_3$ is a hydroxyl group or a substituted or unsubstituted $C_1$ to $C_{20}$ alkoxy group. In an implementation, in Formula 1, $X_1$, $X_2$ and $X_3$ may each independently be, e.g., a hydroxyl group or a substituted or unsubstituted $C_1$ to $C_{20}$ alkoxy group. With this structure, the compound of Formula 1 may be more stably coupled to silica, thereby increasing lifespan of the abrasive agent.

In an implementation, $Y_1$ and $Y_2$ may each independently be, e.g., a bivalent aliphatic hydrocarbon group. In an implementation, $Y_1$ and $Y_2$ may each independently be, e.g., a $C_1$ to $C_5$ alkylene group.

In an implementation, in Formula 1, $R_1$, $R_2$, and $R_3$ may each be, e.g., a hydrogen atom. In this case, the compound of Formula 1 may be an amino group (—$NH_2$)—containing silane.

In an implementation, the compound of Formula 1 may include, e.g., aminoethylaminopropyltrimethoxysilane, aminoethylaminopropyltriethoxysilane, aminoethylaminopropylmethyldimethoxysilane, aminoethylaminopropylmethyldiethoxysilane, aminoethylaminomethyltriethoxysilane, or aminoethylaminomethylmethyldiethoxysilane.

In an implementation, the abrasive agent may include silica modified with a cation derived from the compound of Formula 1.

The cation derived from the compound of Formula 1 means a cation formed by coupling a hydrogen atom or a substituent to at least one of two nitrogen atoms in the compound of Formula 1. The cation may include a monovalent to bivalent cation. In an implementation, the cation may be represented by, e.g., one of Formula 1-1 to Formula 1-3.

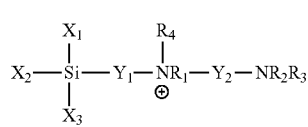

[Formula 1-1]

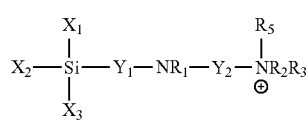

[Formula 1-2]

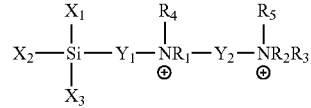

[Formula 1-3]

In Formula 1-1 to Formula 1-3, $X_1$, $X_2$, $X_3$, $Y_1$, $Y_2$, $R_1$, $R_2$, and $R_3$ may be defined the same as those of Formula 1.

$R_4$ and $R_5$ may each independently be, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

In an implementation, the abrasive agent may include silica modified with a salt of the compound of Formula 1. The salt of the compound of Formula 1 means a neutral salt of a cation derived from the compound of Formula 1 and an anion.

The cation may be represented by, e.g., one of Formula 1-1 to Formula 1-3. The anion may include a halogen anion (e.g.: $F^-$, $Cl^-$, $Br^-$, or $I^-$); an organic acid anion, such as a carbonic anion (e.g.: $CO_3^{2-}$, $HCO_3^-$), an acetic anion ($CH_3COO^-$), a citric anion ($HOC(COO^-)(CH_2COO^-)_2$), or the like; a nitrogen-containing anion (e.g.: $NO_3^-$, $NO_2^-$); a phosphorus-containing anion (e.g.: $PO_4^{3-}$, $HPO_4^{2-}$, $H_2PO_4^-$); a sulfur-containing anion (e.g.: $SO_4^{2-}$, $HSO_4^-$); a cyanide anion ($CN^-$), or the like.

Silane compound containing three nitrogen atoms

A silane containing three nitrogen atoms may include, e.g., a compound of Formula 2, a cation derived from the compound of Formula 2, or a salt of the compound of Formula 2:

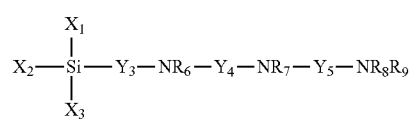

[Formula 2]

In Formula 2, $X_1$, $X_2$ and $X_3$ may be defined the same as those of Formula 1.

$Y_3$, $Y_4$ and $Y_5$ may each independently be, e.g., a single bond, a bivalent aliphatic hydrocarbon group, a bivalent alicyclic hydrocarbon group, or a bivalent aromatic hydrocarbon group.

$R_6$, $R_7$, $R_8$ and $R_9$ may each independently be, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

In an implementation, the abrasive agent may include, e.g., silica modified with the compound of Formula 2.

In an implementation, in Formula 2, $X_1$, $X_2$ and $X_3$ may each independently be, e.g., a hydroxyl group, a substituted or unsubstituted $C_1$ to $C_{20}$ alkyl group, or a substituted or unsubstituted $C_1$ to $C_{20}$ alkoxy group, in which at least one of $X_1$, $X_2$ and $X_3$ is a hydroxyl group or a substituted or unsubstituted $C_1$ to $C_{20}$ alkoxy group. In an implementation, in Formula 2, $X_1$, $X_2$ and $X_3$ may each independently be, e.g., a hydroxyl group or a substituted or unsubstituted $C_1$ to $C_{20}$ alkoxy group. With this structure, the compound of Formula 2 may be more stably coupled to silica, thereby increasing lifespan of the abrasive agent.

In an implementation, in Formula 2, $Y_3$, $Y_4$ and $Y_5$ may each independently be, e.g., a bivalent aliphatic hydrocarbon group. In an implementation, in Formula 2, $Y_3$, $Y_4$ and $Y_5$ may each independently be, e.g., a $C_1$ to $C_5$ alkylene group.

In an implementation, in Formula 2, $R_6$, $R_7$, $R_8$ and $R_9$ may each be, e.g., a hydrogen atom. Here, the compound of Formula 2 may be an amino group (—$NH_2$)—containing silane.

In an implementation, the compound of Formula 2 may include, e.g., diethylenetriaminopropyltrimethoxysilane, diethylenetriaminopropyltriethoxysilane, diethylenetriaminopropylmethyldimethoxysilane, diethylenetriaminopropylmethyldiethoxysilane, or diethylenetriaminomethylmethyldiethoxysilane.

In an implementation, the abrasive agent may include silica modified with a cation derived from the compound of Formula 2.

The cation derived from the compound of Formula 2 means a cation formed by coupling a hydrogen atom or a substituent to a nitrogen atom in the compound of Formula 2. The cation may include a monovalent to trivalent cation. In an implementation, the cation may be represented by, e.g., one of Formulae 2-1 to 2-7.

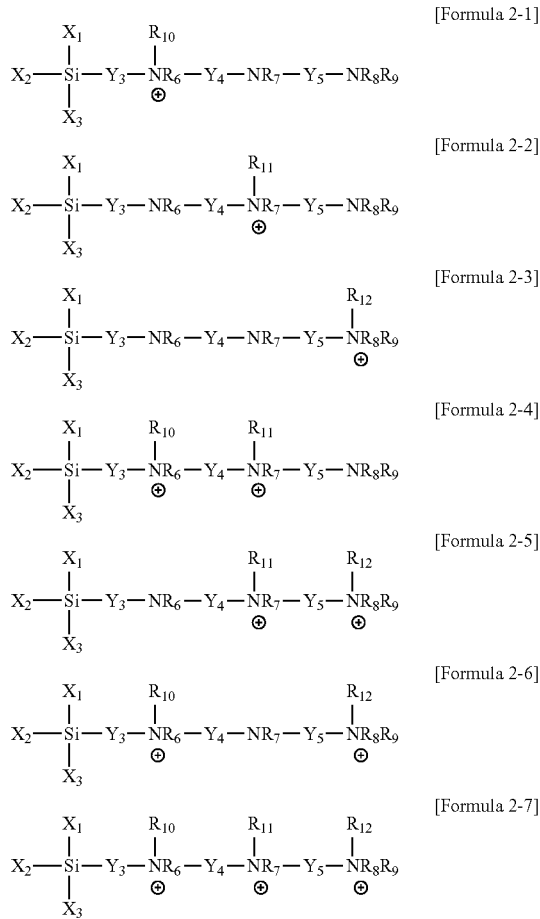

In Formulae 2-1 to 2-7, $X_1$, $X_2$, $X_3$, $Y_3$, $Y_4$, $Y_5$, $R_6$, $R_7$, $R_8$, and $R_9$ may be defined the same as those of Formula 2.

$R_{10}$, $R_{11}$ and $R_{12}$ may each independently be, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

In an implementation, the abrasive agent may include silica modified with a salt of the compound of Formula 2. The salt of the compound of Formula 2 means a neutral salt of a cation derived from the compound of Formula 2 and an anion.

The cation may be represented by any one of Formulae 2-1 to 2-7. The anion may include the same anion as the anion in the salt of Formula 1 or a different anion from the anion therein.

The abrasive agent, e.g., the silica modified with the silane with at least one nitrogen atom, may be present in an amount of, e.g., 0.001 wt % to 20 wt %, 0.001 wt %, 0.1 wt %, 0.5 wt %, 1 wt %, 1.5 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 7.5 wt %, 8 wt %, 8.5 wt %, 9 wt %, 9.5 wt %, 10 wt %, 10.5 wt %, 11 wt %, 11.5 wt %, 12 wt %, 12.5 wt %, 13 wt %, 13.5 wt %, 14 wt %, 14.5 wt %, 15 wt %, 15.5 wt %, 16 wt %, 16.5 wt %, 17 wt %, 17.5 wt %, 18 wt %, 18.5 wt %, 19 wt %, 19.5 wt %, or 20 wt %, 0.01 wt % to 15 wt %, 0.05 wt % to 10 wt %, 0.1 wt % to 5 wt %, or 0.5 wt % to 3 wt %, in the CMP slurry composition. Within these ranges, the composition may help secure a high polishing rate upon polishing of an insulating layer and a tungsten pattern wafer.

Alkylene oxide group-containing fluorine surfactant

In a composition containing the abrasive agent, the alkylene oxide group-containing fluorine surfactant may help suppress adsorption of the by-products produced during polishing or the abrasive agent while maintaining a high polishing rate of an oxide layer. In an implementation, the fluorine surfactant may be present in a smaller amount than other components of the CMP slurry composition, and the CMP slurry composition may still provide the aforementioned effects. A non-fluorine surfactant containing an alkylene oxide group could cause a significant decrease in polishing rate of the oxide layer and significant adsorption of the by-products produced during polishing or the abrasive agent to the polishing pad or the brush. A fluorine surfactant free from an alkylene oxide group could act like an oil substantially not exhibiting hydrophilic properties and could be unlikely to mix with the CMP slurry composition.

The alkylene oxide group-containing fluorine surfactant may be a non-ionic surfactant. The alkylene oxide group may exhibit hydrophilic and non-ionic properties. Here, "alkylene oxide group" may mean *—(R—O)—* [in which R is a $C_2$ to $C_5$ alkylene group and * is a linking site to an element]. In an implementation, R may be, e.g., an ethylene group or a propylene group. In an implementation, the surfactant may contain an ethylene oxide group as the alkylene oxide group. In an implementation, the surfactant may further contain a propylene oxide group as the alkylene oxide group (e.g., in addition to the ethylene oxide group).

The surfactant may include the alkylene oxide group in an amount of greater than 0 moles and less than or equal to 10 moles, e.g., 1, 2, 3, 4, 5, 6, 7, 8, 9, 10 moles, or 5 moles to 10 moles. For example, the number of moles may be a number of moles of the alkylene oxide group per mole/number of the surfactant. Within these ranges, the slurry composition may easily realize the desirable effects described above.

The alkylene oxide group-containing fluorine surfactant may include, e.g., a linear or branched fluorinated $C_1$ to $C_{12}$ alkyl group or a linear or branched fluorinated $C_1$ to $C_{12}$ alkoxy group. In the linear or branched fluorinated $C_1$ to $C_{12}$ alkyl group and the linear or branched fluorinated $C_1$ to $C_{12}$ alkoxy group, the $C_1$ to $C_{12}$ alkyl group may exhibit lipophilic properties to act as the surfactant. Here, "fluorinated" means that 90% or more, e.g., 90% to 100%, of hydrogen atoms coupled to carbon atoms are substituted with fluorine atoms. When 100% of the hydrogen atoms are substituted with fluorine atoms, the corresponding compound may be referred to as "per-fluorinated". In an implementation, the fluorine surfactant may include, e.g., a fluorinated or per-fluorinated $C_6$ to $C_{12}$ alkyl group. In an implementation, the alkyl group may be, e.g., $-CF_3$, $-CF_2CF_3$, $-(CF_2)_2CF_3$, $-(CF_2)_3CF_3$, $-(CF_2)_4CF_3$, $-(CF_2)_5CF_3$, $-(CF_2)_6CF_3$, $-(CF_2)_7CF_3$, $-(CF_2)_8CF_3$, $-(CF_2)_9CF_3$, or the like.

The alkylene oxide group-containing fluorine surfactant may further contain a linear or branched non-fluorinated $C_1$ to $C_{12}$ alkyl group.

In an implementation, the alkylene oxide group-containing fluorine surfactant may include a compound of Formula 3.

$$H-(-O-R^1-)_m-O-A-R^2, \quad \text{[Formula 3]}$$

In Formula 3, $R^1$ may be, e.g., a linear or branched $C_2$ to $C_5$ alkylene group.

A may be, e.g., a single bond or an aliphatic hydrocarbon group.

n may be, e.g., greater than 0 and less than or equal to 10.

$R^2$ may be, e.g., a linear or branched fluorinated $C_1$ to $C_{12}$ alkyl group.

In an implementation, the alkylene oxide group-containing fluorine surfactant may include, e.g., a compound of Formula 4 or a compound of Formula 5.

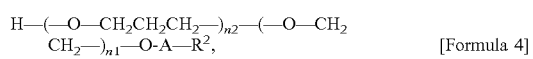
$$H-(-O-CH_2CH_2CH_2-)_{n2}-(-O-CH_2CH_2-)_{n1}-O-A-R^2, \quad \text{[Formula 4]}$$

n1 and n2 may each independently be, e.g., 0 to 10, and the sum of n1 and n2 (n1+n2) may be greater than 0.

A may be, e.g., a single bond or an aliphatic hydrocarbon group.

$R^2$ may be, e.g., a linear or branched fluorinated $C_1$ to $C_{12}$ alkyl group or a linear or branched fluorinated $C_1$ to $C_{12}$ alkoxy group.

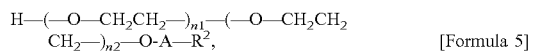
$$H-(-O-CH_2CH_2-)_{n1}-(-O-CH_2CH_2CH_2-)_{n2}-O-A-R^2, \quad \text{[Formula 5]}$$

n1 and n2 may each independently be, e.g., 0 to 10, and the sum of n1 and n2 (n1+n2) may be greater than 0.

A may be, e.g., a single bond or an aliphatic hydrocarbon group; and $R^2$ may be, e.g., a linear or branched fluorinated $C_1$ to $C_{12}$ alkyl group or a linear or branched fluorinated $C_1$ to $C_{12}$ alkoxy group.

In Formula 3, Formula 4, and Formula 5, "aliphatic hydrocarbon group" may be a linear or branched $C_1$ to $C_{10}$ alkylene group.

In an implementation, in Formula 3, n may be in the range of, e.g., 5 to 10.

In an implementation, in Formula 4 and Formula 5, n1 may be in the range of, e.g., 5 to 10 and n2 may be 0; or n2 may be in the range of, e.g., 5 to 10 and n1 may be 0; or each of n1 and n2 may be, e.g., greater than 0 and n1+n2 may be in the range of 5 to 10.

The alkylene oxide group-containing fluorine surfactant may be prepared by a suitable method. In an implementation, the alkylene oxide group-containing fluorine surfactant may be prepared through reaction of a per-fluorinated alcohol with a compound containing an alkylene oxide group.

The alkylene oxide group-containing fluorine surfactant may be present in an amount of, e.g., 0.001 ppm to 200 ppm, 0.001, 0.1, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200 ppm, 0.01 ppm to 100 ppm, 1 ppm to 100 ppm, or 10 ppm to 100 ppm, in the CMP slurry composition. Within these ranges, the alkylene oxide group-containing fluorine surfactant may help suppress adsorption of the abrasive agent and the by-products produced during polishing while preventing reduction in polishing rate of the oxide layer.

The alkylene oxide group-containing fluorine surfactant may be present in an amount of, e.g., 90 wt % or more, 95 wt % to 100 wt %, or 99 wt % to 100 wt %, of all surfactants contained in the CMP slurry composition. Within these ranges, the slurry composition may easily realize the desirable effects described above.

In an implementation, the CMP slurry composition may further include, e.g., an oxidizing agent, a catalyst, an amino acid, or an organic acid.

The oxidizing agent may help oxidize the tungsten pattern wafer to facilitate polishing of the tungsten pattern wafer.

The oxidizing agent may include, e.g., an inorganic percompound, an organic percompound, bromic acid or salts thereof, nitric acid or salts thereof, chloric acid or salts thereof, chromic acid or salts thereof, iodic acid or salts thereof, iron or salts thereof, copper or salts thereof, rare-earth metal oxides, transition metal oxides, or potassium dichromate. Here, the "percompound" refers to a compound that contains at least one peroxide group ($-O-O-$) or an element in the highest oxidation state. In an implementation, the oxidizing agent may be a percompound. In an implementation, the percompound may include, e.g., hydrogen peroxide, potassium periodide, calcium persulfate, or potassium ferricyanide. In an implementation, the percompound may include, e.g., hydrogen peroxide.

The oxidizing agent may be present in an amount of, e.g., 0.01 wt % to 20 wt %, 0.05 wt % to 10 wt %, or 0.1 wt % to 5 wt %, in the CMP slurry composition. Within these ranges, the CMP slurry composition may help improve the polishing rate of the tungsten pattern wafer.

The catalyst may include, e.g., an iron ion compound, a complex compound of iron ions, or a hydrate thereof.

The iron ion compound, the complex compound of iron ions, or the hydrate thereof may help improve the polishing rate of the tungsten pattern wafer.

The iron ion compound may include, e.g., an iron trivalent cation-containing compound. The iron trivalent cation-containing compound may include, e.g., compounds having iron trivalent cations, which are present as free cations in an aqueous solution. In an implementation, the iron trivalent cation-containing compound may include, e.g., iron chloride ($FeCl_3$), iron nitrate ($Fe(NO_3)_3$), or iron sulfate ($Fe_2(SO_4)_3$).

The complex compound of iron ions may include an iron trivalent cation-containing complex compound. The iron trivalent cation-containing complex compound may include a compound or a salt thereof formed by reacting an iron trivalent cation with an organic or inorganic compound having at least one functional group, e.g., carboxylic acids, phosphoric acids, sulfuric acids, amino acids, or amines in an aqueous solution. In an implementation, the organic or inorganic compound may include, e.g., citrate, ammonium citrate, p-toluene sulfonic acid (pTSA), 1,3-propylenediaminetetraacetic acid (PDTA), ethylenediaminetetraacetic acid (EDTA), diethylenetriaminepentaacetic acid (DTPA), nitrilotriacetic acid (NTA), or ethylenediamine-N,N'-disuccinic acid (EDDS). Examples of the iron trivalent cation-containing compound may include ferric citrate, ferric ammonium citrate, Fe(III)-pTSA, Fe(III)-PDTA, and Fe(III)-EDTA.

The catalyst, e.g., the iron ion compound, the complex compound of iron ions, or the hydrate thereof, may be present in an amount of, e.g., 1 ppm to 1,000 ppm, 1 ppm to 500 ppm, 1 ppm to 200 ppm, or 1 ppm to 100 ppm, in the CMP slurry composition. Within these ranges, the CMP slurry composition may help improve the polishing rate of a tungsten layer.

In the CMP slurry composition that includes the abrasive agent containing the modified silica described above, the amino acid may help further increase the polishing rate of a tungsten layer.

The amino acid may include, e.g., glycine, lysine, alanine, histidine, serine, glutamine, valine, leucine, phenylalanine, arginine, aspartic acid, glutamic acid, threonine, asparagine, glutamine, cysteine, proline, or the like. In an implementation, the amino acid may include, e.g., glycine, lysine, alanine, or histidine. In an implementation, the amino acid may include, e.g., glycine.

The amino acid may be present in an amount of, e.g., 0.001 wt % to 10 wt %, 0.005 wt % to 5 wt %, 0.01 wt % to 1 wt %, or 0.02 wt % to 0.5 wt %, in the CMP slurry composition. Within the ranges, the amino acid may help further increase the polishing rate of a tungsten layer.

The organic acid may help improve the polishing rate of the tungsten pattern wafer.

The organic acid may include an organic acid having at least one carboxylic group, e.g., an organic acid having one carboxylic group. In an implementation, the organic acid may include, e.g., acetic acid, propionic acid, butyric acid, or valeric acid.

The organic acid may be present in an amount of, e.g., 0.1 ppm to 1,000 ppm, 0.2 ppm to 500 ppm, 0.5 ppm to 300 ppm, or 1 ppm to 300 ppm, in the CMP slurry composition. Within these ranges, the organic acid may help improve dispersion stability of the abrasive agent to prevent agglomeration or cohesion of the abrasive agent even after use for a long period of time.

The CMP slurry composition may have a pH of, e.g., 3 to 7, 4 to 6, or 5 to 6. Within these ranges, the CMP slurry composition containing the modified silica as the abrasive agent may help realize a high polishing rate of the tungsten pattern wafer upon polishing under a sub-acidic pH condition, as compared with polishing under a strongly acidic condition.

The CMP slurry composition may further include a pH regulator to maintain a suitable pH value.

The pH regulator may include an inorganic acid, e.g., nitric acid, phosphoric acid, hydrochloric acid, or sulfuric acid. The pH regulator may include at least one base, e.g., aqueous ammonia, sodium hydroxide, potassium hydroxide, ammonium hydroxide, sodium carbonate, or potassium carbonate.

The CMP slurry composition may further include a suitable additive, e.g., a surfactant, a dispersant, a modifier, a surface active agent, or the like. In the CMP slurry composition, the additive may be present in an amount of, e.g., 0.01 ppm to 500 ppm, or 0.2 ppm to 100 ppm. Within these ranges, the additive may help realize inherent effects thereof without affecting the polishing rate.

Another embodiment provides a method of polishing a tungsten pattern wafer. The polishing method may include polishing a tungsten pattern wafer using the CMP slurry composition described above.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of components used in Examples and Comparative Examples are as follows.

Preparation Example 1

Silica (zeta potential: +25 mV, average particle diameter: 120 nm) modified with a compound represented by the following Formula 6 was prepared by reacting colloidal silica having an average particle diameter of 120 nm (non-modified silica, PL-7, zeta potential: −25 mV, FUSO) with 0.04 moles of the compound of Formula 6 under acidic conditions of pH 2.5 at 65° C. for 18 hours. The zeta potential was measured using a Zetasizer ZS (Malvern Co., Ltd.).

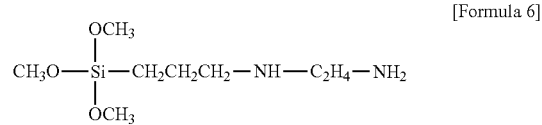

[Formula 6]

Preparation Example 2

Silica (zeta potential: +25 mV, average particle diameter: 120 nm) modified with a compound represented by the following Formula 7 was prepared in the same manner as in Preparation Example 1 except that the compound of the following Formula 7 was used instead of the compound of Formula 6.

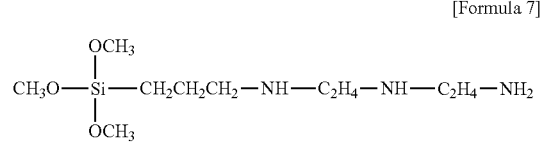

[Formula 7]

Preparation Example 3

Colloidal silica having an average particle diameter (D50) of 120 nm (non-modified silica, PL-7, zeta potential zeta potential: −25 mV, FUSO) was used.

Example 1

A CMP slurry composition having pH 3 was prepared by mixing 1.2 wt % of the modified silica of Preparation Example 1 as an abrasive agent, 30 ppm of a fluorine surfactant, 300 ppm of acetic acid as an organic acid, 25 ppm of Fe-DTPA as an iron ion-containing compound, 0.16 wt % of glycine, 100 ppm of a biocide (B2100, Aju Chemical Industry Co., Ltd.), and a balance of deionized water, based on the total weight of the CMP slurry composition. The composition was regulated to pH 5.5 using nitric acid or aqueous ammonia solution as a pH regulator, thereby preparing a CMP slurry composition for polishing a tungsten pattern wafer. The fluorine surfactant was a compound containing a per-fluorinated $C_6$ alkyl group and 5 moles of an ethylene oxide (EO) group.

Examples 2 to 5

CMP slurry compositions were prepared in the same manner as in Example 1 except that the kind of modified silica and the kind of fluorine surfactant were changed as listed in Table 1.

Comparative Examples 1 to 6

CMP slurry compositions were prepared in the same manner as in Example 1 except that the kind of silica and the kind of surfactant were changed as listed in Table 1.

Polishing evaluation was carried out on the CMP slurry compositions prepared in the Examples and Comparative Examples under the following polishing conditions. Results are shown in Table 1.

[Polishing Evaluation Condition]
1. Polishing machine: Reflexion LK 300 mm (AMAT Co., Ltd.)
2. Polishing condition
   Polishing pad: VP3100/Rohm and Haas Company
   Head speed: 35 rpm
   Platen speed: 33 rpm
   Polishing Pressure: 1.5 psi
   Retainer Ring Pressure: 8 psi
   Slurry flow rate: 250 ml/min
   Polishing time: 60 sec
3. Polishing target
   A commercially available tungsten pattern wafer (MIT 854, 300 mm)
   A mixture was prepared by mixing a CMP slurry for polishing tungsten (STAR PLANAR 7000, Samsung SDI Co., Ltd.) with deionized water in a weight ratio of 1:2, followed by adding hydrogen peroxide to the mixture in an amount of 2 wt % based on the weight of the mixture, thereby preparing a mixed solution, which in turn was used to polish the tungsten pattern wafer. The tungsten pattern wafer was subjected to primary polishing on a polishing machine (Reflexion LK300 mm) using an IC1010/SubaIV Stacked polishing pad (Rodel Co., Ltd.) for 60 seconds under conditions of a head speed of 101 rpm, a platen speed of 33 rpm, a polishing pressure of 2.0 psi, a retainer ring pressure of 8 psi, and a mixed solution flow rate of 250 ml/min. The polishing was performed to remove a tungsten metal layer until oxide/metal patterns were exposed.
4. Polishing rate of oxide layer (unit: A/min): A polishing rate of an oxide layer was calculated based on a difference in film thickness before and after polishing in evaluation under the above polishing conditions using a reflectometer.
5. Zeta potential of by-products produced during polishing (unit: mV): Zeta potential of by-products produced during polishing was measured using a Zetasizer ZS (Malvern Co., Ltd.), after polishing under the above polishing conditions.
6. Content of silicon on pad and brush (unit: wt %): The content of silicon present at each surface of the pad and the brush was measured by energy dispersive spectroscopy (EDS), after polishing under the above polishing conditions.

TABLE 1

| | Abrasive agent | Surfactant | | | | Polishing rate of oxide layer | Zeta potential of by-products produced during polishing | Content of silicon (wt %) | |
| | | Fluorine | Carbon number | EO | PO | | | @pad | @brush |
| --- | --- | --- | --- | --- | --- | --- | --- | --- | --- |
| Example 1 | Preparation Example 1 | Present | 6 | 5 | 0 | 714 | −32 | 5.4 | 2.1 |
| Example 2 | Preparation Example 1 | Present | 6 | 5 | 5 | 813 | −43 | 3.2 | 1.8 |
| Example 3 | Preparation Example 1 | Present | 8 | 7 | 0 | 698 | −36 | 4.2 | 1.2 |
| Example 4 | Preparation Example 1 | Present | 10 | 7 | 0 | 621 | −48 | 3.8 | 1.6 |
| Example 5 | Preparation Example 2 | Present | 6 | 5 | 0 | 723 | −38 | 4.4 | 1.8 |
| Comparative Example 1 | Preparation Example 3 | — | — | — | — | 298 | −38 | 6.1 | 3.6 |
| Comparative Example 2 | Preparation Example 1 | — | — | — | — | 734 | +24 | 10.4 | 6.8 |
| Comparative Example 3 | Preparation Example 1 | Absent | 6 | 5 | 0 | 34 | +16 | 11.2 | 7.2 |

TABLE 1-continued

| | Abrasive agent | Surfactant | | | | Polishing rate of oxide layer | Zeta potential of by-products produced during polishing | Content of silicon (wt %) | |
|---|---|---|---|---|---|---|---|---|---|
| | | Fluorine | Carbon number | EO | PO | | | @pad | @brush |
| Comparative Example 4 | Preparation Example 1 | Absent | 6 | 5 | 5 | 23 | +22 | 13.4 | 8.3 |
| Comparative Example 5 | Preparation Example 1 | Absent | 8 | 7 | 0 | 12 | +14 | 12.1 | 6.4 |
| Comparative Example 6 | Preparation Example 1 | Absent | 10 | 7 | 0 | 11 | +16 | 10.8 | 7.1 |

* In Table 1,

① Surfactant in Examples 1 and 5: Non-ionic surfactant containing a per-fluorinated $C_6$ alkyl group and 5 moles of ethylene oxide (EO) group.
② Surfactant in Example 2: Non-ionic surfactant containing a per-fluorinated $C_6$ alkyl group and 5 moles of an ethylene oxide group and 5 moles of a propylene oxide (PO) group.
③ Surfactant in Example 3: Non-ionic surfactant containing a per-fluorinated $C_8$ alkyl group and 7 moles of an ethylene oxide group.
④ Surfactant in Example 4: Non-ionic surfactant containing a per-fluorinated $C_{10}$ alkyl group and 7 moles of an ethylene oxide group.
⑤ Surfactant in Comparative Example 3: Non-ionic surfactant (free from fluorine) containing a $C_6$ alkyl group and 5 moles of an ethylene oxide group.
⑥ Surfactant in Comparative Example 4: Non-ionic surfactant (free from fluorine) containing a $C_6$ alkyl group and 5 moles of an ethylene oxide group and 5 moles of a propylene oxide group.
⑦ Surfactant in Comparative Example 5: Non-ionic surfactant (free from fluorine) containing a $C_8$ alkyl group and 7 moles of an ethylene oxide group.
⑧ Surfactant in Comparative Example 6: Non-ionic surfactant (free from fluorine) containing a $C_{10}$ alkyl group and 7 moles of an ethylene oxide group.

As shown in Table 1, the CMP slurry compositions according to the Examples reduced the content of silicon present at the polishing pad and the brush, and had a negative zeta potential of by-products produced during polishing and a high polishing rate of an oxide layer upon polishing a tungsten pattern wafer with an abrasive agent modified with a positive charge. As a result, it may be seen that the compositions according to the Examples suppressed adsorption of the abrasive agent and the by-products to the polishing pad or the brush while maintaining a high polishing rate of the oxide layer. Accordingly, although not shown in Table 1, the composition according to the Examples helped increase lifespan of the polishing pad while improving polishing flatness on a polishing target surface upon polishing the tungsten pattern wafer with the abrasive agent modified with a positive charge.

Conversely, as shown in Table 1, the composition of Comparative Example 1 prepared without silica modified with a silane compound containing at least one nitrogen had a very low polishing rate of an oxide layer. In addition, the compositions of Comparative Examples 2 to 6 prepared without an alkylene oxide group-containing fluorine surfactant failed to provide the desirable effects.

By way of summation and review, in order to reduce the content of abrasive particles and to increase a polishing rate of the oxide layer while achieving high flatness, particles modified with a positive charge may be used as abrasive particles in the CMP slurry composition in the step of polishing the metal layer, the barrier layer, and the oxide layer. By-products produced during polishing and the abrasive agent could be adsorbed to or in a polishing pad in the course of polishing a target surface, and there could be a reduction in lifespan of the polishing pad. Moreover, the by-products produced during polishing and the abrasive agent could be continuously adsorbed to a brush for a predetermined period of time in the course of cleaning after polishing, thereby causing a defect in a polishing target.

One or more embodiments may provide a CMP slurry composition for polishing a tungsten pattern wafer, when polishing a tungsten pattern wafer with an abrasive agent modified with a positive charge, which can help suppress adsorption of by-products produced during polishing or the abrasive agent to a polishing pad or a brush, while maintaining a high polishing rate of an oxide layer.

One or more embodiments may provide a CMP slurry composition for polishing a tungsten pattern wafer, when polishing a tungsten pattern wafer with an abrasive agent modified with a positive charge, which may help increase lifespan of a polishing pad while improving polishing flatness on a polishing target surface.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A CMP slurry composition for polishing a tungsten pattern wafer, the CMP slurry composition comprising:
   a solvent;
   an abrasive agent containing silica modified with a silane compound having at least one nitrogen atom; and
   an alkylene oxide group-containing fluorine surfactant,
   wherein:
   the alkylene oxide group-containing fluorine surfactant includes a compound of Formula 4 or a compound of Formula 5, and

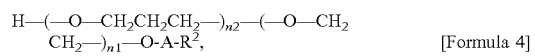
   [Formula 4]

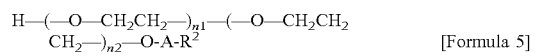
   [Formula 5]

in Formula 4 and Formula 5,
   n1 and n2 are each independently an integer of 0 to 10, and the sum of n1 and n2 (n1+n2) is 6 to 10, A is a single bond or an aliphatic hydrocarbon group, and R$^2$ is a linear or branched fluorinated C$_1$ to C$_{12}$ alkyl group or a linear or branched fluorinated C$_1$ to C$_{12}$ alkoxy group.

2. The CMP slurry composition as claimed in claim 1, wherein the alkylene oxide group-containing fluorine surfactant is a non-ionic surfactant.

3. The CMP slurry composition as claimed in claim 1, wherein the surfactant is a per-fluorinated surfactant.

4. The CMP slurry composition as claimed in claim 1, wherein the silica has a positive charge on a surface thereof.

5. The CMP slurry composition as claimed in claim 1, wherein the silane compound is an amino silane containing 1 to 5 nitrogen atoms.

6. The CMP slurry composition as claimed in claim 1, wherein the CMP slurry composition includes:

0.001 wt % to 20 wt % of the abrasive agent, 0.001 ppm to 200 ppm of the surfactant, 0.1 ppm to 1,000 ppm of an organic acid, 1 ppm to 1,000 ppm of a catalyst, and 0.001 wt % to 10 wt % of an amino acid.

7. The CMP slurry composition as claimed in claim 1, wherein the composition has a pH of 3 to 7.

8. A method of polishing a tungsten pattern wafer, the method comprising polishing a tungsten pattern wafer using the CMP slurry composition as claimed in claim 1.

* * * * *